United States Patent
Kupcsik et al.

(10) Patent No.: US 11,644,515 B2
(45) Date of Patent: May 9, 2023

(54) METHOD AND DEVICE FOR OPERATING AN ELECTRICALLY DRIVABLE MOTOR VEHICLE DEPENDING ON A PREDICTED STATE OF HEALTH OF AN ELECTRICAL ENERGY STORE

(71) Applicant: Robert Bosch GmbH, Stuttgart (DE)

(72) Inventors: Andras Gabor Kupcsik, Boeblingen (DE); Christian Simonis, Leonberg (DE); Christoph Woll, Gerlingen (DE); Reinhardt Klein, Mountain View, CA (US)

(73) Assignee: ROBERT BOSCH GMBH, Stuttgart (DE)

( * ) Notice: Subject to any disclaimer, the term of this patent is extended or adjusted under 35 U.S.C. 154(b) by 86 days.

(21) Appl. No.: 17/318,367

(22) Filed: May 12, 2021

(65) Prior Publication Data
US 2021/0373082 A1     Dec. 2, 2021

(30) Foreign Application Priority Data

May 27, 2020    (DE) ......................... 102020206592.6

(51) Int. Cl.
*G01R 31/392*      (2019.01)
*B60L 58/16*        (2019.01)
*G01R 31/367*      (2019.01)

(52) U.S. Cl.
CPC ............ *G01R 31/392* (2019.01); *B60L 58/16* (2019.02); *G01R 31/367* (2019.01)

(58) Field of Classification Search
CPC ...... G01R 31/392; G01R 31/367; B60L 58/16
See application file for complete search history.

(56) References Cited

U.S. PATENT DOCUMENTS

| | | | |
|---|---|---|---|
| 9,395,419 B2 * | 7/2016 | Park ..................... | G01R 31/392 |
| 2016/0221465 A1 * | 8/2016 | Kratzer ................. | H02J 7/0048 |
| 2017/0003352 A1 * | 1/2017 | Barre .................... | G01R 31/007 |
| 2017/0120766 A1 * | 5/2017 | Huber ................... | H01M 10/48 |
| 2017/0240064 A1 * | 8/2017 | Lee ......................... | B60L 58/16 |
| 2020/0164763 A1 * | 5/2020 | Holme .................... | B60L 58/10 |
| 2021/0181263 A1 * | 6/2021 | Hametner ............. | G01R 31/374 |

FOREIGN PATENT DOCUMENTS

DE         102018201119 A1     7/2019

* cited by examiner

*Primary Examiner* — Raymond L Nimox
(74) *Attorney, Agent, or Firm* — Norton Rose Fulbright US LLP; Gerard Messina

(57) ABSTRACT

A computer-implemented method for operating a motor vehicle, in particular an electrically drivable motor vehicle, depending on a predicted state of health of an electrical energy store, in particular a vehicle battery. The method includes: providing vehicle parameters which influence the state of health of the electrical energy store; predicting the vehicle parameters at a prediction point in time; ascertaining the predicted state of health depending on the predicted vehicle parameters with the aid of a data-based state of health model which is trained to output a state of health of the electrical energy store depending on the vehicle parameters; and signaling the predicted state of health.

14 Claims, 3 Drawing Sheets

METHOD AND DEVICE FOR OPERATING AN ELECTRICALLY DRIVABLE MOTOR VEHICLE DEPENDING ON A PREDICTED STATE OF HEALTH OF AN ELECTRICAL ENERGY STORE

CROSS REFERENCE

The present application claims the benefit under 35 U.S.C. § 119 of German Patent Application No. DE 102020206592.6 filed on May 27, 2020, which is expressly incorporated herein by reference in its entirety.

FIELD

The present invention relates to electrically drivable motor vehicles, in particular electric vehicles or hybrid vehicles, and furthermore measures for determining a state of health (SOH) of an electrical energy store.

BACKGROUND INFORMATION

The energy supply of electrically drivable motor vehicles is carried out with the aid of an electrical energy store, usually with a so-called vehicle battery. The state of health of the vehicle battery increasingly declines over the course of its service life which results in a declining storage capacity. One measure of the aging depends on usage behavior.

While the instantaneous state of health may be determined with the aid of a physical aging model based on historic operating state characteristics, it is not possible, however, to reliably predict the state of health, e.g., in order to derive therefrom a remaining service life of the vehicle battery. The individual load of the vehicle battery depends on the vehicle type and/or on the driving behavior of a driver, and correspondingly has a vehicle-specific influence on the course of the state of health.

SUMMARY

According to the present invention, a method is provided for operating a motor vehicle, in particular an electrically drivable motor vehicle, depending on a predicted state of health of an electrical energy store, in particular a vehicle battery, and a device and a drive system are provided.

Example embodiments of the present invention are described herein.

According to a first aspect of the present invention, a computer-implemented method is provided for operating a motor vehicle, in particular an electrically drivable motor vehicle, depending on a predicted state of health of an electrical energy store, in particular a vehicle battery. In accordance with an example embodiment of the present invention, the method includes the following steps:
  providing vehicle parameters which influence the state of health of the electrical energy store;
  predicting the vehicle parameters at a prediction point in time;
  ascertaining the predicted state of health depending on the predicted vehicle parameters with the aid of a data-based state of health model which is trained to output a state of health of the electrical energy store depending on the vehicle parameters;
  signaling the predicted state of health.

The state of health of a rechargeable electrical energy store, in particular a vehicle battery, is usually not directly measured. This would require a series of sensors in the vehicle battery, which would make manufacture of such a battery complex and would increase the required space. In addition, automotive-compliant methods for state of health determination in the vehicle are not yet available on the market. Therefore, the instantaneous state of health is generally ascertained with the aid of a physical aging model. This physical aging model is very inaccurate and has model deviations of more than 5%. Due to the inaccuracy of the physical aging model, this may additionally merely specify the instantaneous state of health of the vehicle battery. A prediction of the state of health, which depends in particular on the operation of the vehicle battery, e.g., on the level and quantity of the charge inflow and charge outflow, and thus on the vehicle parameters, would lead to very inaccurate predictions and is presently not provided.

The above method now provides a driver and vehicle-specific prediction of a state of health of the electrical energy store based on a data-drivable state of health model. The data-based state of health model may be generated with the aid of analyzed fleet data.

The data-based state of health model may be configured as a hybrid model which applies a correction value, which results from a data-based correction model, in particular through addition or multiplication, to a modeled state of health, which is ascertained with the aid of a physical or physically-motivated aging model.

The state of health model may have a hybrid architecture, which uses the previously known physical aging model for the state of health and combines this with a data-based trainable correction model. The correction model (machine learning model) may thereby compensate for the inaccuracies of the physical aging model. Depending on the selection of the correction model, prediction uncertainties may be evaluated by a quantified variance prediction, whereby a long-term prediction for the load conditions of the electrical energy store is possible.

In accordance with an example embodiment of the present invention, a feature of the method is the prediction of a state of health with the aid of a hybrid state of health model which employs the usable physical prior knowledge and fleet data from a plurality of vehicles. The correction model is thereby trained in order to compensate for the inaccuracies of the physical aging model, which may occur due to individual vehicle parameters, driver-specific load patterns, or additional environmental influences.

Due to the high inaccuracy of the physical model for the state of health, a prediction of a future state of health of the electrical energy store is so inaccurate that this may not be used to determine a service life or an exchange point in time for the electrical energy store. By using the hybrid state of health model, a continuous correction of the physically-modeled state of health is facilitated, which is ascertained with the aid of the physical model, and thus the calculation of the state of health, in particular a prediction value, is continuously adapted based on the available fleet data. By using a central unit to calculate the respective state of health, the most updated fleet data may always be taken into consideration.

An additional advantage is that a predicted state of health is provided or indicated in the motor vehicle, whose value may not erratically change due to the use of the hybrid state of health model, since the correction model behaves neutrally in the case of unknown vehicle parameter sets with respect to the results of the physical model, such as, it tends toward 0 when applied additively or toward 1 when applied multiplicatively.

Furthermore, the data-drivable state of health model may be trained and/or provided external to the vehicle using vehicle parameter sets and assigned load conditions of the respective electrical energy stores based on fleet data.

By determining fleet data and taking the same into consideration in the correction model, the prediction of the future state of health of an electrical energy store in a motor vehicle may be noticeable more precisely.

According to one specific embodiment of the present invention, the state of health of the electrical energy store may be indicated as remaining charge capacity with respect to an initial charge capacity or as an indicator of a remaining service life.

It may be provided that the vehicle parameters may indicate the state of health of the electrical energy store and, in particular, may include one or multiple of the following parameters: a battery temperature, a temporal load pattern, an age of the electrical energy store, a period of use of the electrical energy store, a cumulative charge over the service life and a cumulative discharge over the service life, a maximum charge current, a maximum discharge current, a charging frequency, an average charge current, an average discharge current, an average state of charge, a spread of the state of charge, histogram data about the state of charge, temperature, voltage, current, power throughput during charging and discharging, charging frequency, and charging temperature.

Furthermore, ascertaining the predicted state of health may be carried out depending on the predicted vehicle parameters with the additional aid of surroundings parameters, the surroundings parameter including one or multiple of the following parameters: traffic data which indicate information about traffic volume on a predicted route, weather data, and the location of the motor vehicle.

According to one specific embodiment of the present invention, ascertaining the predicted state of health may be carried out depending additionally on the predicted vehicle parameters, the predicted vehicle parameters being ascertained by extrapolating the vehicle parameters at the prediction point in time.

It may be provided that the data-based state of health model may include a neural network, a Bayesian neural network, or a Gaussian process model. It should be noted that particularly reliable results are achieved with the aid of the Gaussian process model.

Furthermore, the predicted state of health may be ascertained externally to the vehicle and communicated to the relevant motor vehicle, or model parameters of the data-based state of health model are communicated to the motor vehicle and the predicted state of health is ascertained in the motor vehicle.

It may be provided that stress factors, which are taken into consideration in the data-based state of health model to determine the predicted state of health, may be ascertained from historic profiles of vehicle parameters, the stress factors including in particular one or multiple of the following pieces of information: a frequency of charging with high currents, a frequency of driving at constantly high output, such as, an output above a predefined threshold performance, a frequency of charging at high surroundings temperature, such as, a temperature above a predefined threshold temperature, and frequency of a complete charging of the electrical energy store.

According to another aspect of the present invention, a device is provided, in particular a control unit for operating a motor vehicle, in particular an electrically drivable motor vehicle, depending on a predicted state of health of an electrical energy store, in particular a vehicle battery. In accordance with an example embodiment of the present invention, the device is configured to include the following steps:

providing vehicle parameters which influence the state of health of the electrical energy store;

predicting the vehicle parameters at a prediction point in time;

ascertaining the predicted state of health depending on the predicted vehicle parameters with the aid of a data-based state of health model which is trained to output a state of health of the electrical energy store depending on the vehicle parameters;

signaling the predicted state of health.

BRIEF DESCRIPTION OF THE DRAWINGS

Specific embodiments of the present invention are explained in greater detail by way of the figures.

DETAILED DESCRIPTION OF EXAMPLE EMBODIMENTS

Figure 1:
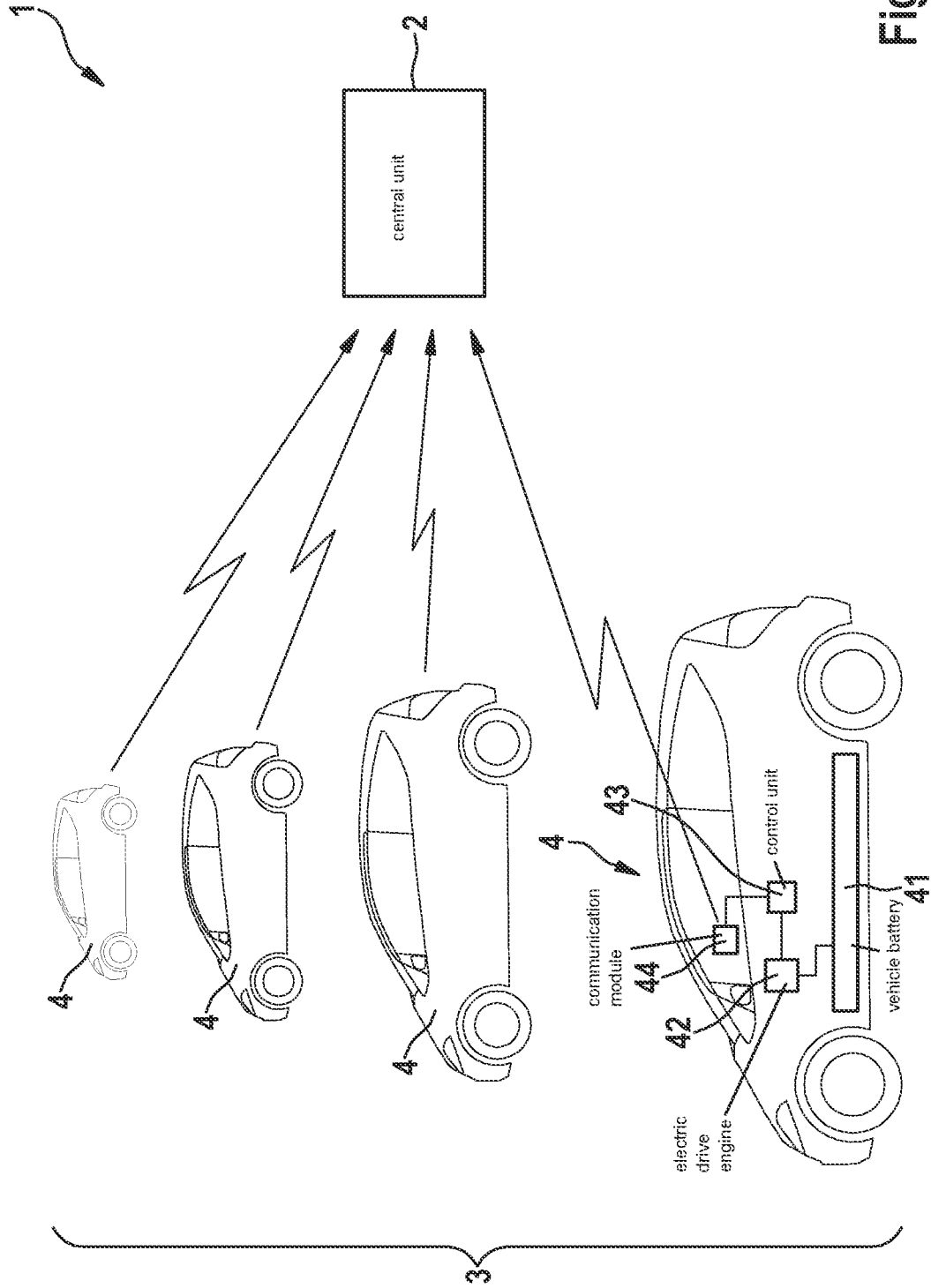
FIG. 1 shows a schematic depiction of a system for provided driver- and vehicle-specific load conditions of a vehicle battery based on fleet data, in accordance with an example embodiment of the present invention.

FIG. 1 shows a system 1 for collecting fleet data in a central unit 2 for creating a state of health model. The state of health model is used to determine a state of health of an electrical energy store in a motor vehicle. FIG. 1 shows a vehicle fleet 3 including multiple motor vehicles 4.

One of motor vehicles 4 is depicted in more detail in FIG. 1. Motor vehicles 4 each have a vehicle battery 41 as a rechargeable electrical energy store, an electric drive engine 42, and a control unit 43. Control unit 43 is connected to a communication module 44 which is suited for transferring data between respective motor vehicle 4 and a central unit (a so-called cloud).

Figure 2:
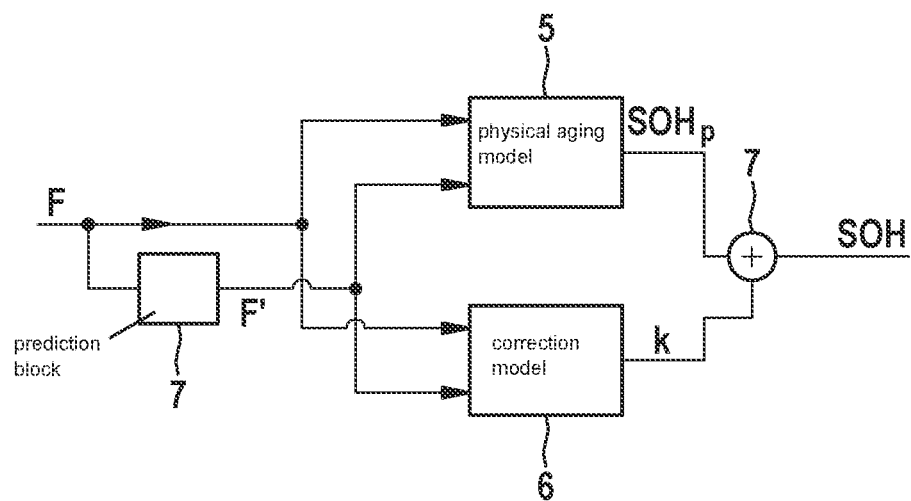
FIG. 2 shows a schematic depiction of a functional configuration of a hybrid state of health model, in accordance with an example embodiment of the present invention.

FIG. 2 schematically shows the functional configuration of one specific embodiment of a state of health model which is configured in a hybrid way. The state of health model includes a physical aging model 5 and a correction model 6, whose outputs are applied to one another, in particular added or multiplied, to obtain a state of health SOH at an instantaneous or future point in time. On the input side, physical aging model 5 and correction model 6 receive vehicle parameters F and vehicle parameters predicted in a prediction block 7, which have been ascertained by extrapolation from the vehicle parameters. Vehicle parameters F may include usage history parameters which indicate past operating history of the vehicle battery or of vehicle 4 in a compressed form.

Figure 3:
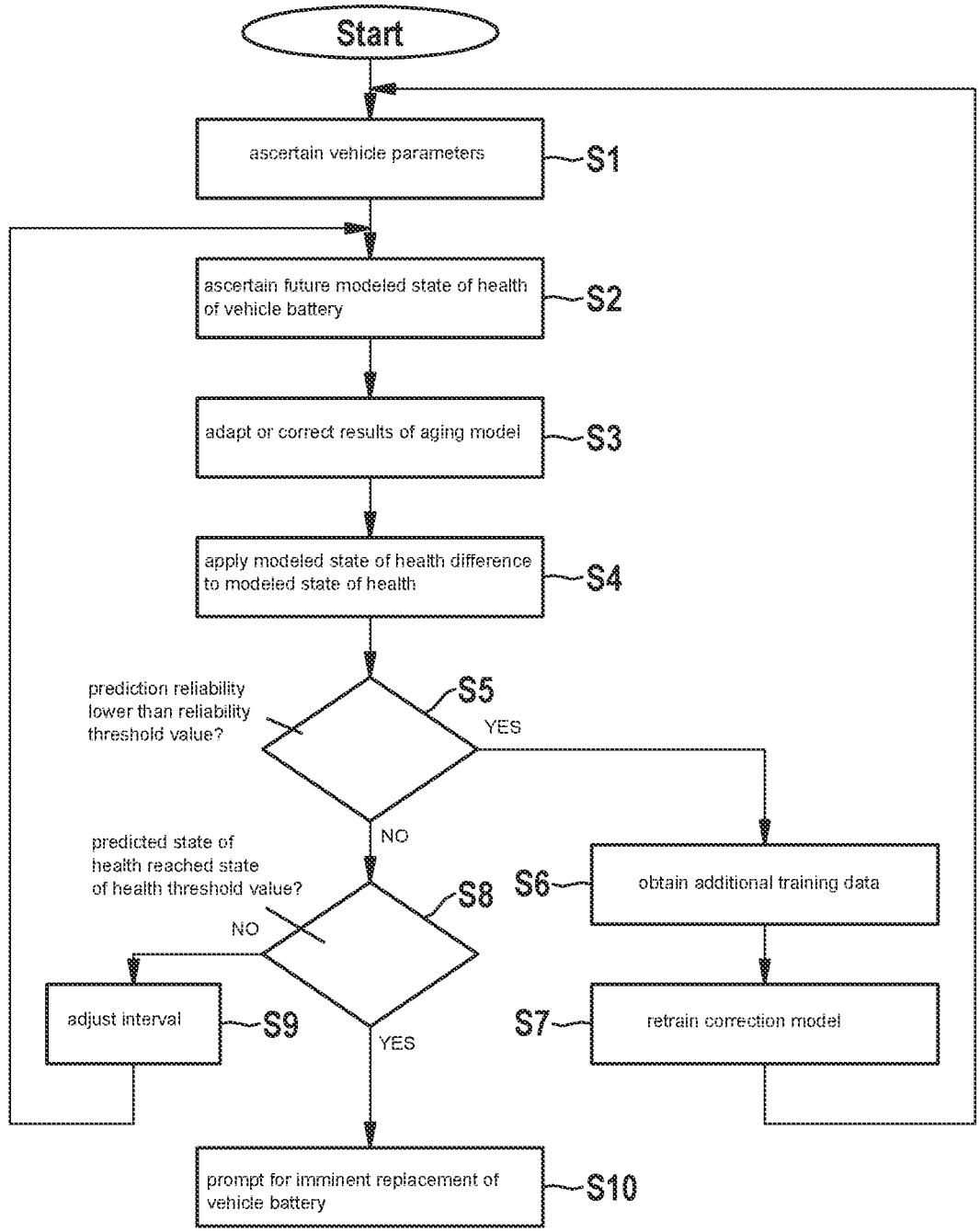
FIG. 3 shows a flowchart to illustrate a method for predicting a state of health of a vehicle battery in a motor vehicle and for ascertaining a predicted service life, in accordance with an example embodiment of the present invention.

A flowchart is depicted in FIG. 3, which depicts the sequence of a method for ascertaining a future state of health SOH. The state of health of a battery, also called SOH may, for example, be indicated as a remaining maximum charge capacity with respect to an initial maximum charge capacity, as an indication of remaining service life, or in another way, which indicates a degradation of the quality or the usability of vehicle battery 41.

Future state of health SOH(t) may be used, for example, in a method for ascertaining a predicted remaining service life of vehicle battery 41 in motor vehicles 4. This predicted remaining service life may be used to determine a date or the exchange point in time with respect to vehicle battery 41. The method may be implemented in central unit 2 or in control unit 43 in hardware and/or software.

In step S1, vehicle parameters, based on driver behavior, the vehicle condition, and or the battery condition, are ascertained for the specific vehicle and transmitted to central unit 2 with the aid of communication module 44.

Vehicle parameters F indicate parameters which depend on the state of health SOH of the vehicle battery. The vehicle parameters may include, in particular, usage history parameters which indicate past operating histories of the vehicle battery in a compressed form, so that these are suited for updating the prediction of a predicted state of health SOH. The usage history parameters may include one or multiple of the following parameters: a battery temperature, temporal load pattern, i.e., charging and driving cycles determined by use patterns (e.g., quick charging at high current levels or strong accelerations or strong regenerative braking processes), an age of the vehicle battery, a period of use of the vehicle battery, a cumulative charge over the service life and a cumulative discharge over the service life, a maximum charge current, a maximum discharge current, a charging frequency, an average charge current, an average discharge current, a power throughput during charging and discharging, a charging frequency, (an, in particular, average) charging temperature, an average state of charge, (an, in particular, average) spread of the state of charge, histogram data about the state of charge, temperature, voltage, current, etc., and the like.

In addition, surroundings parameters may be transmitted to central unit 2 as part of the vehicle parameters F or detected or ascertained there, the surroundings parameters indicating information about the surroundings and/or a situation of the surroundings of motor vehicle 4. The surroundings parameters may include one or multiple the following parameters: traffic data, information about traffic volume on a predicted route, weather data, and the location of the motor vehicle.

Aside from the vehicle parameters, a usage prediction may be carried out in prediction block 7 by updating the temporal load pattern, which facilitates the creation of a respective vehicle parameter set for future points in time. In particular, information, which depends on load profiles, may also be assumed as constant for the future, e.g., charging frequency. Trends of individual vehicle parameters may also be updated for the prognosis of predicted state of health SOH, in order to use predicted vehicle parameters F' to ascertain the state of health SOH.

The usage prediction mapped into predicted vehicle parameters F' generally extends over multiple months up to years, so that the remaining residual service life of the battery may be determined using derived battery stress factors. The usage prediction data may contain one or multiple stress factors which indicate one or more stress levels to which the vehicle battery is exposed. These may include information about the frequency of charging with high currents such as during quick charging, a frequency of driving at constant high output, a frequency of a charging at high surroundings temperature, e.g., during the midday heat or at a highway rest area after a long drive at high output (as a combination of stress factors), a frequency of a complete charge of the battery. The stress factors may also be dependent on the battery cell chemistry, so that many of the abovementioned factors may stress the battery more or less. This may be carried out in control unit 43. Alternatively, usage prediction data may be transferred, together with the vehicle parameters and the surroundings parameters, to central unit 2.

Furthermore, the most recently ascertained state of health SOH of vehicle battery 41 (electrical energy store) is transmitted to central unit 2.

The vehicle parameters and the predicted vehicle parameters and also the instantaneous state of health SOH, transmitted to central unit 2, are processed with the aid of a data-based state of health model in order to predict a state of health SOH of vehicle battery 41 based on the predicted vehicle parameters.

In order to use previous knowledge, in the form of a physical aging model for state of health SOH, the state of health model, as shown in FIG. 2, may be designed as a hybrid model. The state of health model includes a physical aging model 5, which in step S2 ascertains a future modeled state of health SOH of vehicle battery 41 based on the predicted vehicle parameters of a vehicle parameter set. Predicted vehicle parameters F' correspond to vehicle parameters F' predicted at a predefined point in time in the future, in particular based on the updated extrapolated use data.

An adaptation or correction of the results (modeled state of health $SOH_p$) of the aging model is carried out in step S3 with the aid of a trained correction model 6.

Correction model 6 may be data-based as a neural network, a Bayesian neural network, a Gaussian process model, random forest, SVM regressor, or the like. Correction model 6 is trained to compensate for deviations which result due to inaccuracies of the vehicle parameters or the underlying physical aging model.

Correction model 6 is thereby trained, based on vehicle parameter sets from a plurality of vehicles 4, which each include battery and vehicle data from respectively multiple vehicle parameters F of a motor vehicle 4, and based on corresponding actually measured load conditions of vehicle batteries, which were established, for example, at the point in time of a replacement or maintenance. Additionally, the vehicle parameter sets may take respective use history parameters, in the form of historic vehicle parameter data, such as Ah (amps per hour) throughput (charging/discharging), temperature, current, voltage, state of charge, kilometers drivable, use and charge behavior, and stress factors for battery aging resulting therefrom (such as high temperatures at simultaneously high SOC) and modeled state of health $SOH_p$, determined in each case by the physical aging model, into consideration as training data.

By assigning the vehicle parameter set of a motor vehicle, if necessary, the historic vehicle parameter data and, if necessary, the modeled state of health $SOH_p$ (output of physical aging model 5) to a state of health difference between modeled state of health $SOH_p$ for the vehicle parameter set and the measured state of health, correction model 6 may be correspondingly trained in a known way. The state of health difference may be ascertained as a difference or quotient between state of health $SOH_p$ modeled for the vehicle parameter set and the correspondingly measured state of health. The training data may be ascertained based on diagnostic measurements (to ascertain the actual state of health) in the vehicle or alternatively based on test stand or repair shop measurements, which indicate a state of health SOH of vehicle battery 41.

Predicted state of health SOH then results in step S4 by applying the modeled state of health difference as a model output of correction model 6 to modeled state of health $SOH_p$. This correction value K is applied additively or multiplicatively to modeled state of health $SOH_p$ of physical aging model 5.

The use of correction model 6 and/or physical aging model 5 may be carried out in central unit 2 for each motor vehicle 4 in communicative connection. Alternatively, steps S2-S3 may be ascertained in control units 43 of motor vehicles 4 after transmission of the instantaneous model parameters of correction model 6 to respective motor vehicles 4 of vehicle fleet 3.

Depending on the selected machine learning model, the prediction of correction model 6 may include a prediction reliability. The prediction reliability may be checked in step S5 in order to establish if a retraining of correction model 6 is necessary in order to carry out the prediction of the state of health with a required accuracy. If it is established that the prediction reliability is lower than a reliability threshold value (alternative: yes), then in step S6 additional training data are obtained which are used for retraining correction model 6 in step S7. The training data may be carried out through diagnostic measurements in vehicle 4 or alternatively through test stand or repair shop measurements, so that a state of health may be obtained or derived. The method then subsequently continues at step S1.

Otherwise, i.e., if it is established that the predictive reliability is higher than a predictive threshold value (alternative: no), then the method continues at step S8.

If the state of health is indicated as a proportion of the initial charge capacity of the vehicle battery, then steps S2 through S3 may be carried out iteratively using vehicle parameters predicted at different points in time in the future, in order to ascertain the future point in time at which the predicted state of health SOH reaches or falls below a predefined state of health threshold value, e.g., a threshold value which indicates that the maximum charge capacity of the vehicle battery corresponds to only 80% of the initial charge capacity. This is carried out by step S8, in that it checks whether the predicted state of health SOH has reached the state of health threshold value.

If this is not the case (alternative: no), then in step S9, the point in time, at which the predicted state of health SOH is indicated, is adjusted corresponding to the interval between predicted state of health SOH and the state of health threshold value, and the method jumps back to step S2. In addition, predicted state of health SOH may be displayed, so that this may schedule a maintenance or a battery replacement. If necessary, the predicted state of health may be taken into consideration for route calculations and planning of charge cycles (more often at lower maximum charge capacity). If predicted state of health SOH has essentially reached the state of health threshold value (alternative: yes), then the reaching of the state of health threshold value is signaled in step S10 and the driver is prompted for an imminent replacement of the vehicle battery.

By using correction model 6, the accuracy of the information of the state of health and thus the information of a prediction of the future state of health is improved, as, in particular, deviations based on different driving and operating behaviors of motor vehicles 4 may be compensated by the correction model.

By using the hybrid state of health model, in which the correction model merely indicates a correction value K, in cases, in which no sufficient training of the correction model is present for a vehicle parameter set, predicted state of health SOH may be ascertained as modeled state of health $SOH_p$, which results from the physical aging model, as the correction model outputs a correction value of approximately zero at these points.

The correction model in the central unit may be retrained at regular intervals, in the case of insufficient predictive accuracy of a vehicle battery, using new fleet data, i.e., vehicle parameters from multiple other motor vehicles including a measured state of health, in order to make the correction model more precise.

What is claimed is:

1. A computer-implemented method for operating a motor vehicle, depending on a predicted state of health of an electrical energy store, the method comprising:
    providing vehicle parameters which influence a state of health of the electrical energy store;
    predicting the vehicle parameters at a prediction point in time;
    ascertaining the predicted state of health depending on the predicted vehicle parameters using a data-based state of health model which is trained to output a state of health of the electrical energy store depending on the vehicle parameters;
    signaling the predicted state of health; and
    checking whether the predicted state of health has reached a state of health threshold value, and if not, then a point in time, at which the predicted state of health is indicated, is adjusted corresponding to an interval between the predicted state of health and the state of health threshold value; and
    operating the motor vehicle based on a route calculation and a planned charge cycle, which are based on the predicted state of health.

2. The method as recited in claim 1, wherein the motor vehicle is an electrically drivable motor vehicle, and the electrical energy store is a vehicle battery.

3. The method as recited in claim 1, wherein the data-based state of health model is trained and/or provided external to the vehicle using vehicle parameter sets and assigned load states of the electrical energy store based on fleet data.

4. The method as recited in claim 1, wherein the state of health of the electrical energy store is indicated as remaining maximum charge capacity with respect to an initial charge capacity or as an indicator of a remaining service life.

5. The method as recited in claim 1, wherein the vehicle parameters indicate the state of health of the electrical energy store and include one or multiple of the following parameters: a temperature of the electrical energy store, a temporal load pattern, an age of the electrical energy store, a period of use of the electrical energy store, a cumulative charging over the service life and a cumulative discharge over the service life, a maximum charge current, a maximum discharge current, a charging frequency, an average charge current, an average discharge current, a power throughput during charging and discharging, a charging frequency, and a charging temperature.

6. The method as recited in claim 1, wherein the ascertaining of the predicted state of health is carried out depending on the predicted vehicle parameters also using surroundings parameters, the surroundings parameters including one or multiple of the following parameters: traffic data, information about traffic volume on a predicted route, weather data, and a location of the motor vehicle.

7. The method as recited in claim 1, wherein the ascertaining of the predicted state of health is carried out depending on the predicted vehicle parameters, at least one of the predicted vehicle parameters being ascertained by extrapolating the vehicle parameters at a point in time of the prediction.

8. The method as recited in claim 1, wherein data-based state of health model is configured as a hybrid model which applies a correction value, which results from a data-based correction model, through addition or multiplication, to a modeled state of health, which is ascertained using a physical or physically-motivated aging model.

9. The method as recited in claim 1, wherein the data-based state of health model includes a neural network, or a Bayesian neural network, or a Gaussian process model.

10. The method as recited in claim 1, wherein the predicted state of health is ascertained externally to the vehicle and communicated to the motor vehicle, or model parameters of the data-based state of health model are communicated to the motor vehicle and the predicted state of health is ascertained in the motor vehicle.

11. The method as recited in claim 1, wherein stress factors, which are taken into consideration in the data-based state of health model to determine the predicted state of health, are ascertained from historic profiles of vehicle parameters, the stress factors including in one or multiple of the following pieces of information: a frequency of charging with high currents, a frequency of driving at constantly high output, a frequency of charging at high surroundings temperature, and a frequency of a complete charge of the electrical energy store.

12. A control apparatus for operating a motor vehicle, based on a predicted state of health of an electrical energy store, comprising:
a control unit configured to perform the following:
providing vehicle parameters which influence the state of health of the electrical energy store;
predicting the vehicle parameters at a prediction point in time;
ascertaining the predicted state of health depending on the predicted vehicle parameters using a data-based state of health model which is trained to output a state of health of the electrical energy store depending on the vehicle parameters; and
signaling the predicted state of health; and
checking whether the predicted state of health has reached a state of health threshold value, and if not, then a point in time, at which the predicted state of health is indicated, is adjusted corresponding to an interval between the predicted state of health and the state of health threshold value; and
operating the motor vehicle based on a route calculation and a planned charge cycle, which are based on the predicted state of health.

13. The control unit as recited in claim 12, wherein the motor vehicle is an electrically drivable motor vehicle, and the electrical energy store is a vehicle battery.

14. A non-transitory machine-readable memory medium, on which is stored a computer program, which is executable by a processor, comprising:
a program arrangement including program code for operating a motor vehicle depending on a predicted state of health of an electrical energy store, by performing the following:
providing vehicle parameters which influence a state of health of the electrical energy store;
predicting the vehicle parameters at a prediction point in time;
ascertaining the predicted state of health depending on the predicted vehicle parameters using a data-based state of health model which is trained to output a state of health of the electrical energy store depending on the vehicle parameters; and
signaling the predicted state of health;
checking whether the predicted state of health has reached a state of health threshold value, and if not, then a point in time, at which the predicted state of health is indicated, is adjusted corresponding to an interval between the predicted state of health and the state of health threshold value; and
operating the motor vehicle based on a route calculation and a planned charge cycle, which are based on the predicted state of health.

\* \* \* \* \*